(12) United States Patent
Sri-Jayantha et al.

(10) Patent No.: US 9,550,258 B2
(45) Date of Patent: Jan. 24, 2017

(54) METHOD AND SYSTEM FOR THERMOMECHANICALLY DECOUPLING HEATSINK

(71) Applicant: GLOBALFOUNDRIES INC., Grand Cayman (KY)

(72) Inventors: Sri M Sri-Jayantha, Ossining, NY (US); Gerard McVicker, Jr., Stormville, NY (US); Vijayeshwar D Khanna, Jr., Millwood, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 700 days.

(21) Appl. No.: 13/931,098

(22) Filed: Jun. 28, 2013

(65) Prior Publication Data

US 2015/0000868 A1 Jan. 1, 2015

(51) Int. Cl.
| | | |
|---|---|---|
| H01L 23/40 | (2006.01) | |
| B23P 15/26 | (2006.01) | |
| H05K 7/20 | (2006.01) | |
| H01L 23/36 | (2006.01) | |
| H01L 23/367 | (2006.01) | |
| H01L 23/433 | (2006.01) | |
| H01L 23/42 | (2006.01) | |

(52) U.S. Cl.
CPC ............... *B23P 15/26* (2013.01); *H01L 23/36* (2013.01); *H01L 23/3675* (2013.01); *H01L 23/4093* (2013.01); *H01L 23/4338* (2013.01); *H05K 7/2039* (2013.01); *H01L 23/42* (2013.01); *H01L 2224/16225* (2013.01); *H01L 2224/32225* (2013.01); *H01L 2224/73204* (2013.01); *H01L 2224/73253* (2013.01); *H01L 2924/0002* (2013.01); *H01L 2924/15311* (2013.01); *H01L 2924/3511* (2013.01); *Y10T 29/49826* (2015.01)

(58) Field of Classification Search
CPC .............................................. H01L 2023/4081
USPC ........ 165/80.2, 80.3, 81, 185; 361/704, 719, 361/720
See application file for complete search history.

(56) References Cited

U.S. PATENT DOCUMENTS

| | | | | |
|---|---|---|---|---|
| 5,148,860 A | * | 9/1992 | Bettini | B64G 1/50 165/185 |
| 5,570,271 A | * | 10/1996 | Lavochkin | H01L 23/4093 165/185 |
| 5,796,324 A | * | 8/1998 | Ross et al. | H01F 27/292 174/84 S |
| 5,812,374 A | * | 9/1998 | Shuff | H05K 7/20545 165/185 |
| 5,870,285 A | | 2/1999 | Kosteva et al. | |
| 5,870,286 A | | 2/1999 | Butterbaugh et al. | |

(Continued)

FOREIGN PATENT DOCUMENTS

CN 202111283 U 1/2012

OTHER PUBLICATIONS

United States Office Action dated Jun. 17, 2015 in U.S. Appl. No. 14/045,076.

(Continued)

*Primary Examiner* — Allen Flanigan
(74) *Attorney, Agent, or Firm* — Yuanmin Cai; Andrew M. Calderon; Roberts Mlotkowski Safran Cole & Calderon P.C.

(57) ABSTRACT

A structure and method of mounting a heat sink having a body and mounting points configured so as to connect to a mounting medium, at least one of the mounting points being configured to allow movement in a thermally-induced expansion direction.

5 Claims, 18 Drawing Sheets

(56) References Cited

U.S. PATENT DOCUMENTS

| | | | |
|---|---|---|---|
| 5,926,369 A | 7/1999 | Ingraham et al. | |
| 6,007,349 A | 12/1999 | Distefano et al. | |
| 6,019,166 A * | 2/2000 | Viswanath et al. | H01L 21/67109 118/724 |
| 6,061,240 A | 5/2000 | Butterbaugh et al. | |
| 6,356,445 B1 | 3/2002 | Mochzuki et al. | |
| 7,262,969 B2 | 8/2007 | Lee et al. | |
| 7,354,276 B2 | 4/2008 | Dittmann | |
| 7,363,964 B2 * | 4/2008 | Lin et al. | H01L 23/367 165/80.3 |
| 7,423,880 B1 | 9/2008 | Tang | |
| 7,532,475 B2 | 5/2009 | Michel et al. | |
| 8,406,009 B2 * | 3/2013 | Lev et al. | H05K 1/0271 174/138 E |
| 8,421,218 B2 | 4/2013 | Chainer | |
| 2003/0024688 A1 * | 2/2003 | Dowdy et al. | H01L 23/4093 165/80.3 |
| 2003/0085453 A1 | 5/2003 | Eyman et al. | |
| 2008/0158842 A1 * | 7/2008 | Stiborek | H01L 21/4853 361/783 |
| 2010/0246132 A1 * | 9/2010 | Cao et al. | H01L 23/4006 361/704 |
| 2011/0038125 A1 | 2/2011 | Cao et al. | |
| 2012/0181008 A1 * | 7/2012 | Lin et al. | F28D 15/0275 165/185 |

OTHER PUBLICATIONS

Final Office Action in related U.S. Appl. No. 14/045,076 dated May 4, 2016, 6 pages.

* cited by examiner

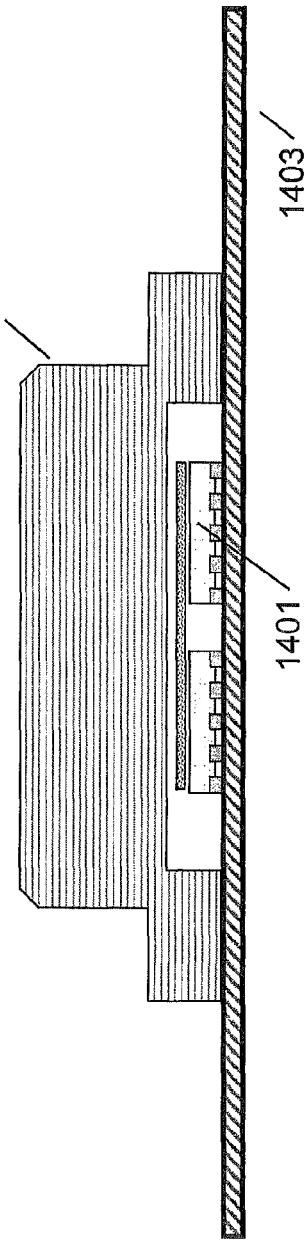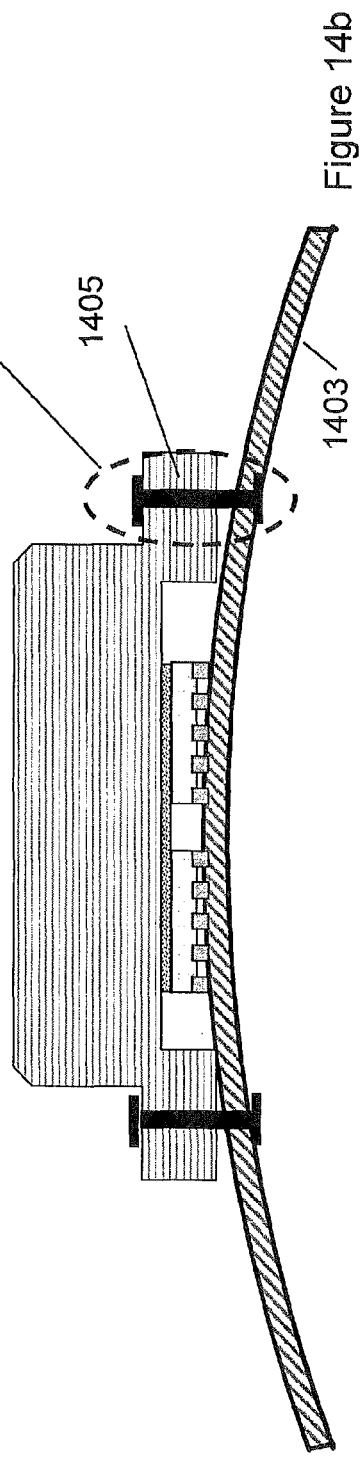

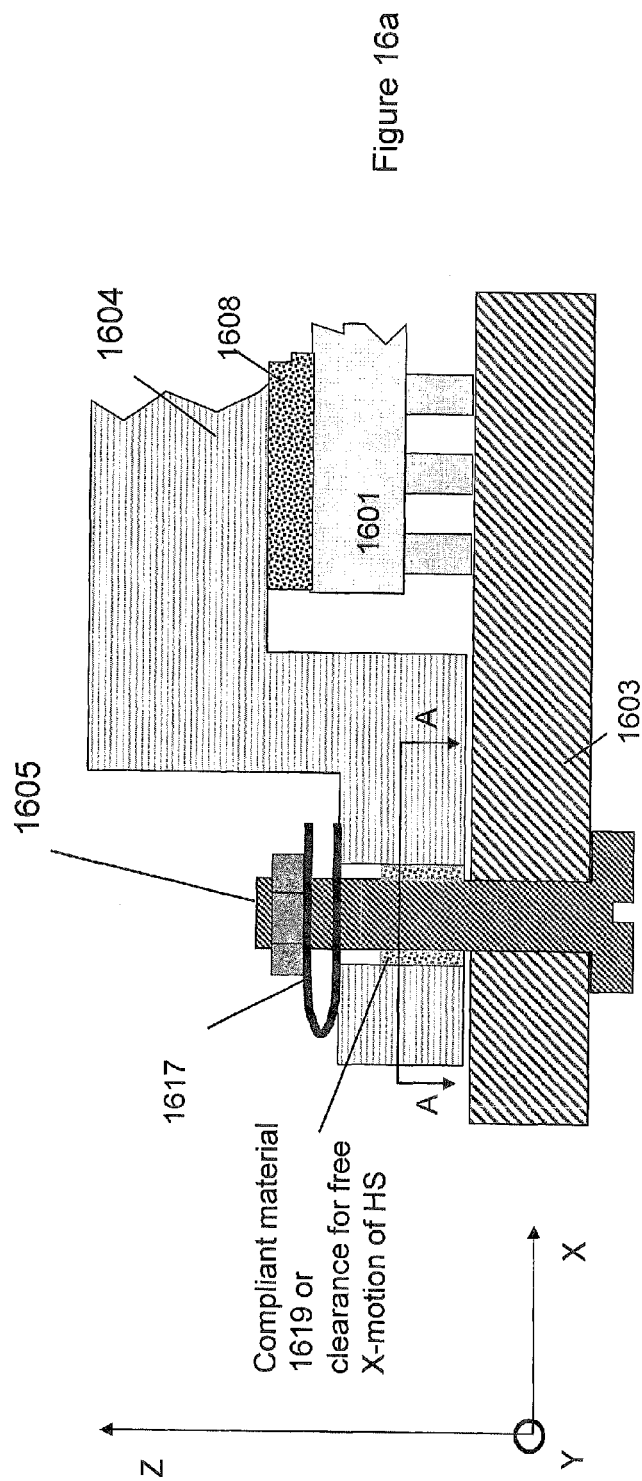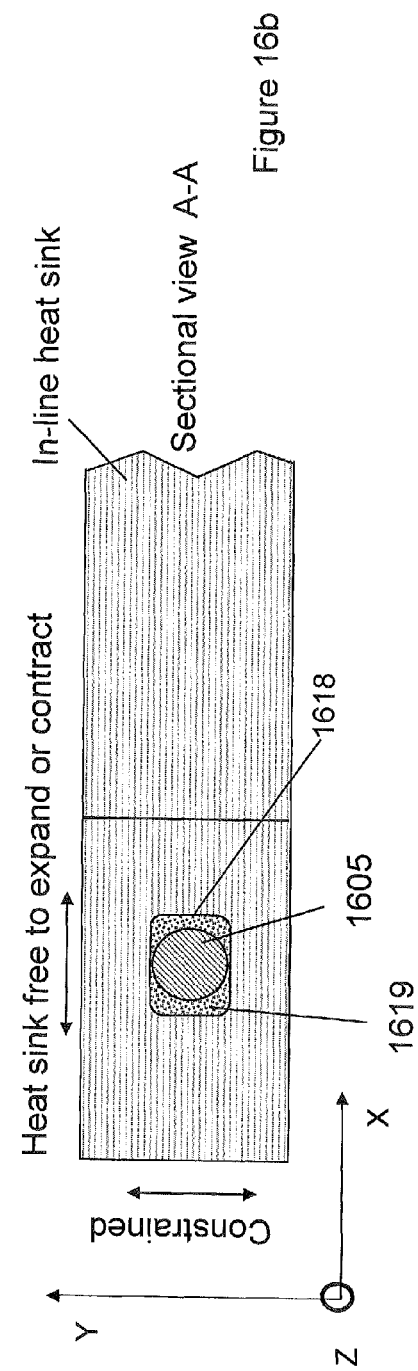

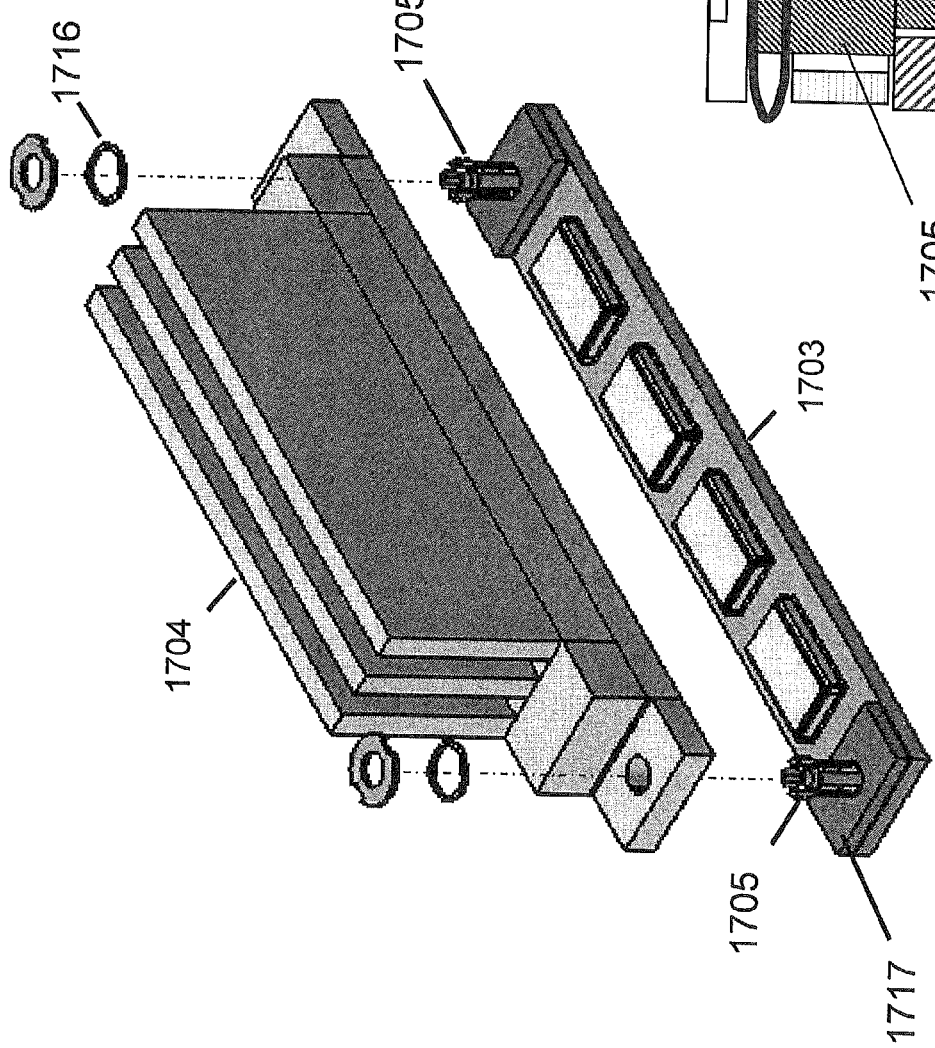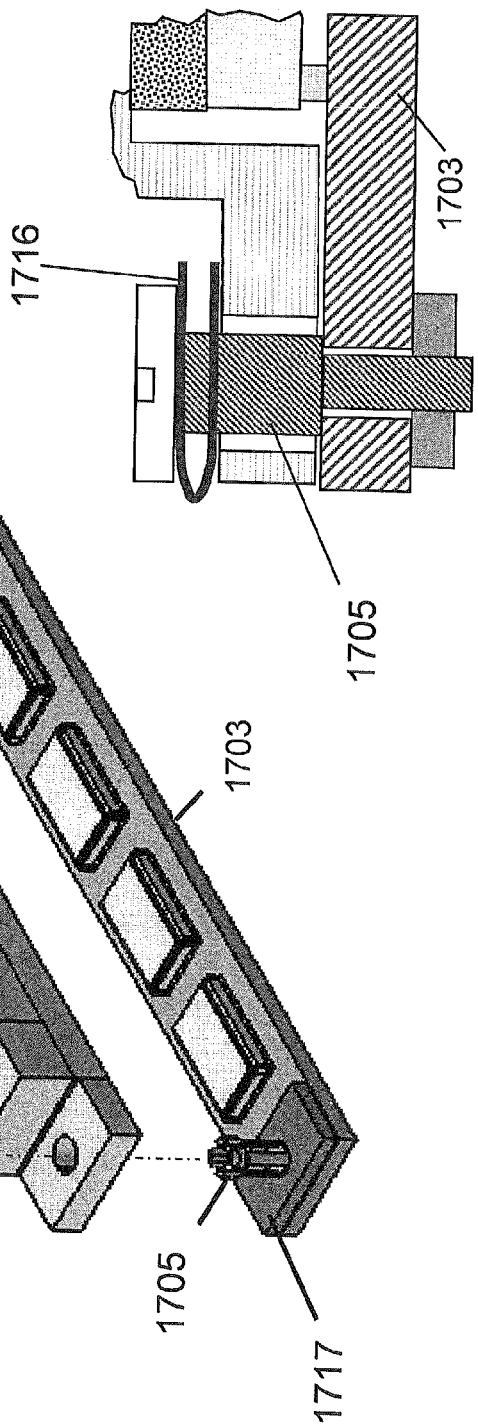
Figure 17a
Figure 17b

METHOD AND SYSTEM FOR THERMOMECHANICALLY DECOUPLING HEATSINK

BACKGROUND OF THE INVENTION

Field of the Invention

The present invention generally relates to a system and method for thermal management of electronic modules and chip scale packages. More particularly the invention relates to providing heat sink mounting methods that decouple the circuit board from a thermomechanically driven deformation, induced by thermal or power cycles, while maintaining required liner shock robustness.

Description of the Related Art

An electronic product such as a computer system is built by integrating a diverse set of components, each made from different set of materials. FIG. 1 shows an assembled computer with a microprocessor unit 1 which is attached to an organic substrate 2 which in turn is attached to a printed circuit board (PCB) 3. Lead free solder interconnects 9 are used to electrically link the above components.

High performance computers are usually built using a ceramic based substrate with multiple processors and memory modules, situated adjacent to the processors. Due to high heat dissipated in the microprocessor unit 1, thermal performance becomes critical to achieving a reliable computer system. To provide efficient heat removal various types of heat sinks are used in practice. Most cost effective heat sinks are air cooled, but for high heat dissipation, liquid or vapor cooled heat sinks are utilized.

A heat sink (HS) 4 typically removes the heat generated from a processor die (e.g., microprocessor unit 1) through a thin thermal interface material (TIM) 8. A preload is imparted on the TIM 8, for example with a preload mechanism 19, in order to keep the thermal conduction thickness to the minimum, typically at about 25 µm. FIG. 1, for example, shows an air cooled system. The laminate polymer material (e.g., printed circuit board 3) and metallic heat sinks 4 are known to have different coefficient of thermal expansion.

Due to power or thermal cycling, discussed subsequently, a computer system is subjected to differential expansion and contraction between individual components. The heat sink 4 and laminate primarily produce a thermomechanically induced strain in critical components. Of particular interest is the strain induced at the edge of the TIM 8 and within solder interconnects 9 that can lead to tearing or fatigue failure respectively, thus negatively impacting the reliability of a computer system.

FIG. 1 corresponds to a microprocessor unit 1 that is made of a silicon die with a substantial foot print (25×25 mm). In this case the heat sink 4 also has to have a substantial foot print in the X-Y plane. Because of the wider foot print and relatively large mass, the heat sink 4, in this case, is mounted rigidly on four solid posts 5, one on each corner. It is noted that in order to illustrate additional elements only one of the four solid posts 5 is illustrated in FIG. 1, but the solid posts (mounting posts) are in fact located in each of the four corners (e.g., as illustrated in FIG. 5 which will be discussed subsequently).

In another application, several chip scale packages (CSPs) 201, providing auxiliary functions such as regulating voltage, may be arranged in-line as shown in FIG. 2. In this case, the thermal management is achieved by a single heat sink 204 covering multiple devices. In the in-line layout, the TIM 208 can extend over the CSP 201. Since the foot print of a CSP 201 in this case is relatively small (6×4 mm), the heat sink 204 tends to be narrow and long, primarily extending along one axis. Typically the heat sink 204 in the in-line mounting is held by two riveted joints 205 placed at the ends. Observe that a solid mounting post or a riveted joint 205 does not allow substantial relative motion between the heat sink 201 and the PCB 203. This condition will be referred to as "no-slip" joint or boundary condition.

Based on the two real life electronic packages that have been described, a heat sink mounting can be either in-plane (X-Y) (e.g., see FIGS. 1 and 5) or in-line (along X or Y) (e.g., see FIG. 2).

Computer systems and data centers are turned on and off regularly which gives rise to thermal cycles. Also, while under power-on-state, an intermittent work load could drive a computer in to and out of active mode from idle mode, generating a highly transient temperature condition. In both cases, differential thermal expansion of components is driven by the thermal and power cycles, causing cyclic strain within critical components. In order to guarantee reliability of parts that are used to build a computer system, rigorous accelerated tests to accentuate field conditions are applied at the development stage by power and thermal cycling the system, as shown in FIG. 3. The ramp rate and dwell times within, for example a 30 minute cycle, are important parameters in determining the reliability of a package.

Once the thermal goals are met by suitable choice of a heat sink, a computer system must be designed to withstand linear shipping shock. Hence, the challenge is to support a heat sink, typically 2 to 3 kg in mass for a high end module, arranged on top of a microprocessor unit (also referred to as a die) without substantially straining the TIM.

FIG. 4 shows a schematic side view of a heat sink 404 supporting a microprocessor 401 and a memory module 412. Any relative motion between the heat sink 404 and the die (e.g., microprocessor 401 or memory module 412) could strain the TIM material 408, and excess strain could lead to tearing of the TIM 408. In addition to linear shock, the products can also be subjected to inadvertent rotational shock. Hence, the heat sink mounting must provide robustness against shock induced damage of TIM 408 or any other vulnerable component.

FIG. 4 also shows a shock pulse in X-direction applied to the PCB 403. To minimize shear strain in TIM 408 the heat sink 404 must be rigidly mounted using high stiffness posts 405 at four corners of the HS 404 so that relative motion between PCB 403 and HS 404 is minimized. FIG. 4 also includes a ceramic substrate 402 and a stiffener plate 414.

FIG. 5 shows a plan view and the location of the four mounting posts 405 that support HS 404. A solid post tends to have a large stiffness against bending, and it certainly prevents large relative motion during a shock which is a positive attribute. However, during power on-off cycle or during thermal cycling, the heat sink 404 made of either aluminum or copper expands at a different rate than the PCB 403. It is not only due to difference in coefficient of thermal expansion (CTE) between HS 404 and PCB 403, but also due to difference in thermal conductivity and heat capacity that determine the time constant of transient heat spreading. During the power ramp up the HS 404 pushes the four mounting posts 405 along the expansion vector (usually along the diagonal) and forces the printed circuit board assembly to bend through the lever arm provided by the mounting posts 405.

FIG. 6 shows an estimated thermal map in a computer assembly corresponding to FIG. 4 ten seconds after maximum power was released. When power is applied to the microprocessor and memory, the temperature rises non-uniformly across various components as illustrated by FIG. 6.

FIG. 7 shows an estimated thermal map for the corresponding deformed state of the system due to thermomechanical interaction between the heat sink and the adjoining structure. The deformation creates distortion of TIM gap which can lead to TIM failure. Similarly, the solder joints (not illustrated) are also subjected to cyclic strain.

Heat sinks are widely used by the industry and various methods of supporting them have been disclosed in the prior art. One conventional device suggests plastically formed supports with locking features so that heat sink could be easily removed to rework a computer in the field. Another conventional device envisages the use of flexible interposing elements between the solder joints and solder pads that would reduce the strain in the solder due to thermally induced deformation. Another conventional device describes a method to reduce stress between the die surface and heat sink surface by means of cantilever means embedded within a TIM material. The cantilever beams do not support the weight of a heat sink. Another conventional device introduces compliant support of a heat sink in order to manage the preload applied to the TIM material. However, in the prior art, no consideration is given to the thermomechanical coupling effects or methods to mitigate it. The majority of the prior art covering heat sink mounting focuses on preload control and ease of removability.

SUMMARY

In view of the foregoing, and other, exemplary problems, drawbacks, and disadvantages of the conventional systems, it is an exemplary feature of the present invention to provide a device and method that allows for a reliable operation of a heat sink.

An exemplary aspect of the invention may include a heat sink including a body and mounting points configured so as to connect to a mounting medium. At least one of the mounting points is configured to allow movement in a thermally-induced expansion direction.

Another exemplary aspect of the invention is embodied as a method of mounting a heat sink. The method including providing a heat sink having a plurality of mounting points, and attaching a plurality of mounting members to the heat sink at the plurality of mounting points, respectively, at least one of a combination of the mounting points and the mounting members being configured so as to have a stiffness in a thermally-induced expansion direction of the heat sink at the respective mounting point which is less than a stiffness in an other direction at the respective mounting point.

Another exemplary aspect of the invention may include a heat sink to be mounted on a printed circuit board. The heat sink including a body, and flexural posts attached to the body so as to decouple thermomechanically induced expansion.

The above aspects may provide a thermally decoupled heat sink.

BRIEF DESCRIPTION OF THE DRAWINGS

The foregoing and other purposes, aspects and advantages will be better understood from the following detailed description of exemplary non-limiting embodiments of the invention with reference to the drawings, in which:

FIGS. 14a and 14b show an in-line heat sink providing thermal management for two surface mounted modules. The mismatch in coefficient of thermal expansion could drive cyclic strain of solder joints;

FIGS. 16a and 16b illustrate the details of a slip-enabling heat sink mount. The second end of the heat sink (not shown) is secured by a no-slip design;

FIGS. 17a and 17b illustrate another slip-enabled mount using split-post. The split-post provides compliance.

DETAILED DESCRIPTION OF EXEMPLARY EMBODIMENTS OF THE INVENTION

Figure 1:
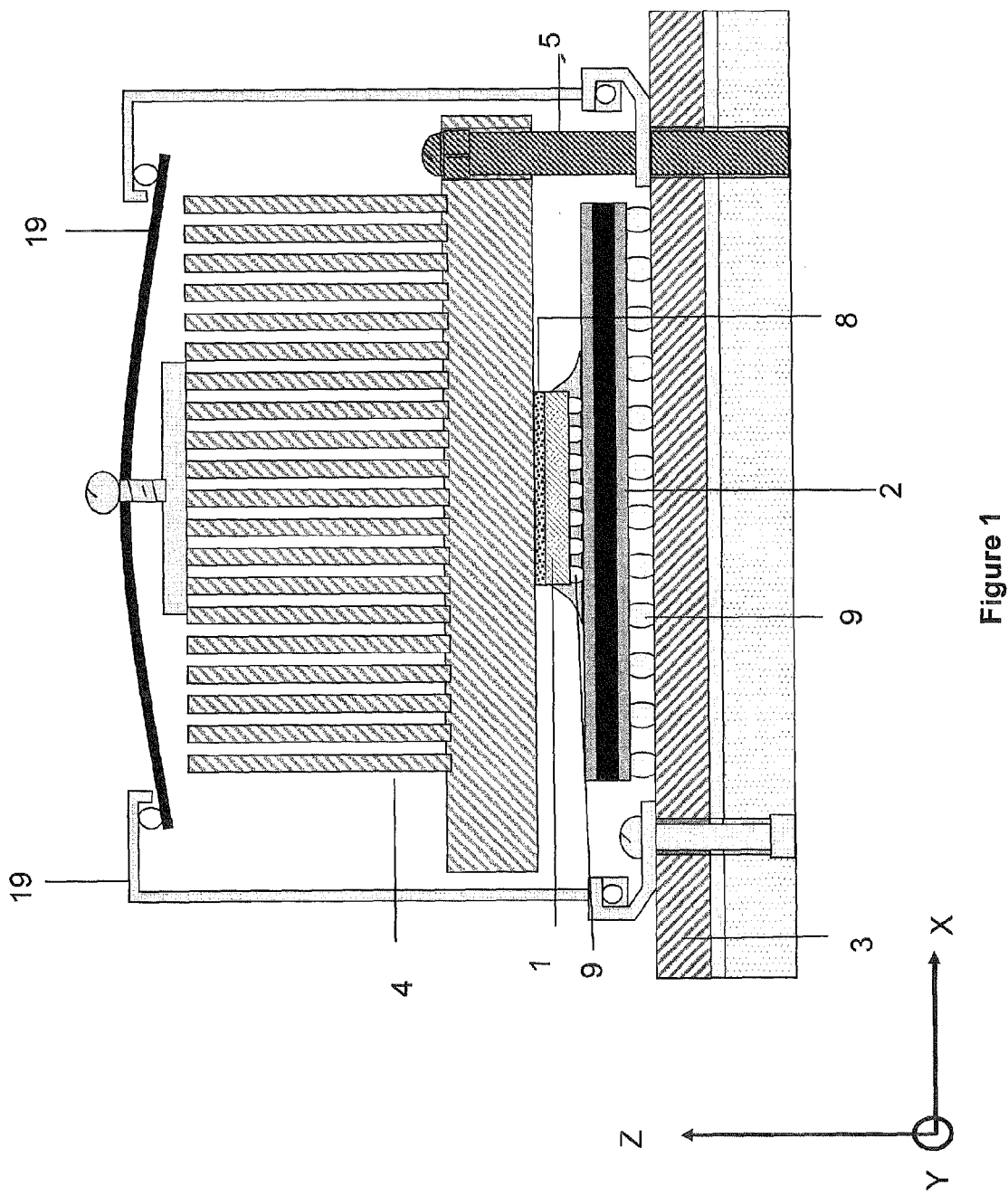
FIG. 1 illustrates a related art heat sink mounting arrangement on an organic module carrying a microprocessor unit.

The present invention addresses the limitations encountered in the conventional method of mounting a heat sink to a PCB. The conventional mounting posts essentially impose a "no-slip" boundary condition which strongly couples a heat sink to a printed circuit board detrimentally. Thermally driven expansion and contraction of key components are coupled and the ensuing deformation strains critical components unfavorably. The present invention provides several design methods that can constructively decouple a heat sink from PCB without compromising the shock robustness of the computer system.

For example, in case of an in-plane heat sink, four rigid mounting posts can be replaced by four flexural posts. The flexural posts are oriented to present least resistance to thermal expansion vector at mounting point while providing high stiffness against linear shock along X or Y axis and rotational shock about Z-axis. Optionally, to damp out any dynamic oscillatory movement between heat sink and PCB, a dampening material can be sandwiched between the flexural elements.

In the case of an in-line heat sink, two mounting post or rivets may be replaced by one mounting post and a flexural joint or by one rivet and a slip joint.

In case of cascaded in-line heat sink, one joint can be made of a mounting post and all others are replaced by flexured joints. Alternatively, one joint is made of a rivet and all others by slip-enabled joints. In general, one fixed boundary condition and several slip boundary conditions are utilized.

In case of an in-line heat sink, a rigid heat sink may be asymmetrically slotted to increase compliance along the X-axis while conventional mounting posts or rivets are used on both ends.

It is, therefore, an exemplary feature of the present invention to provide a structure and method for a thermomechanically decoupled heat sink.

Referring now to the drawings, and more particularly to FIGS. 8a-18, there are shown exemplary, non-limiting, embodiments of the method and structures according to the present invention.

Figure 4:
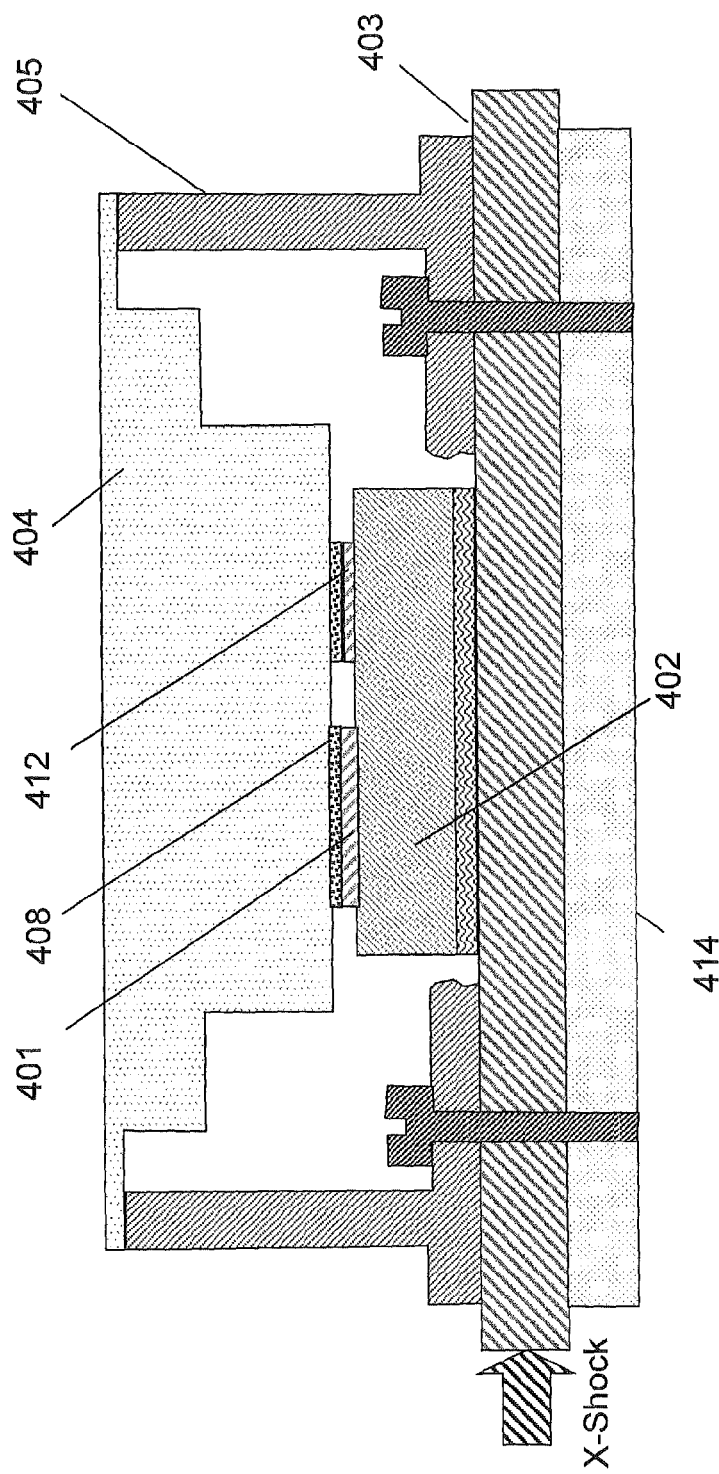
FIG. 4 illustrates an example of in-plane heat sink assembly set on top of a microprocessor and memory module using rigid mounting posts.
Figure 5:
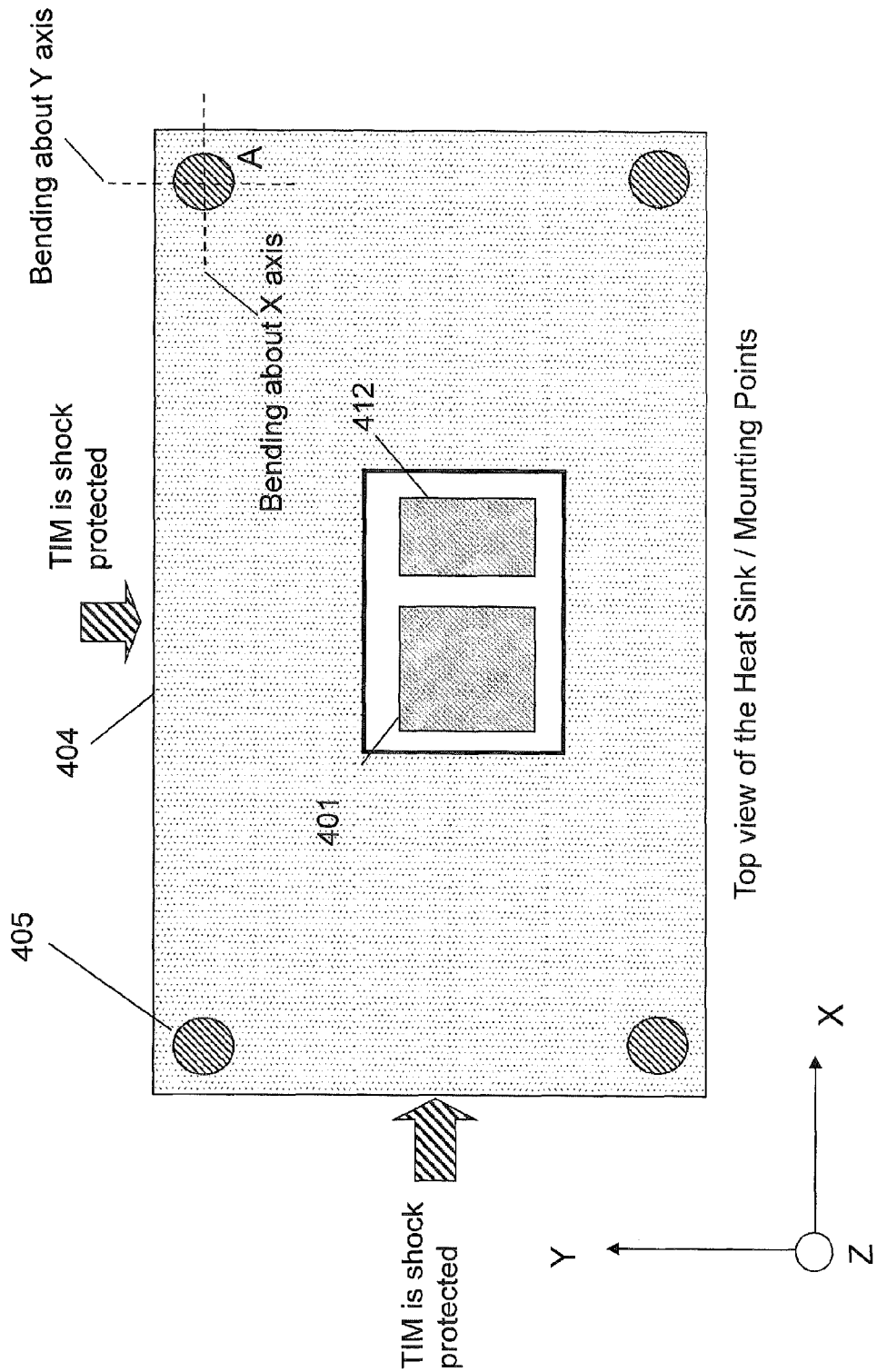
FIG. 5 illustrates a plan view of the in-plane heat sink (shown transparent) supported by four corner mounting posts having a circular cross section.
Figure 6:
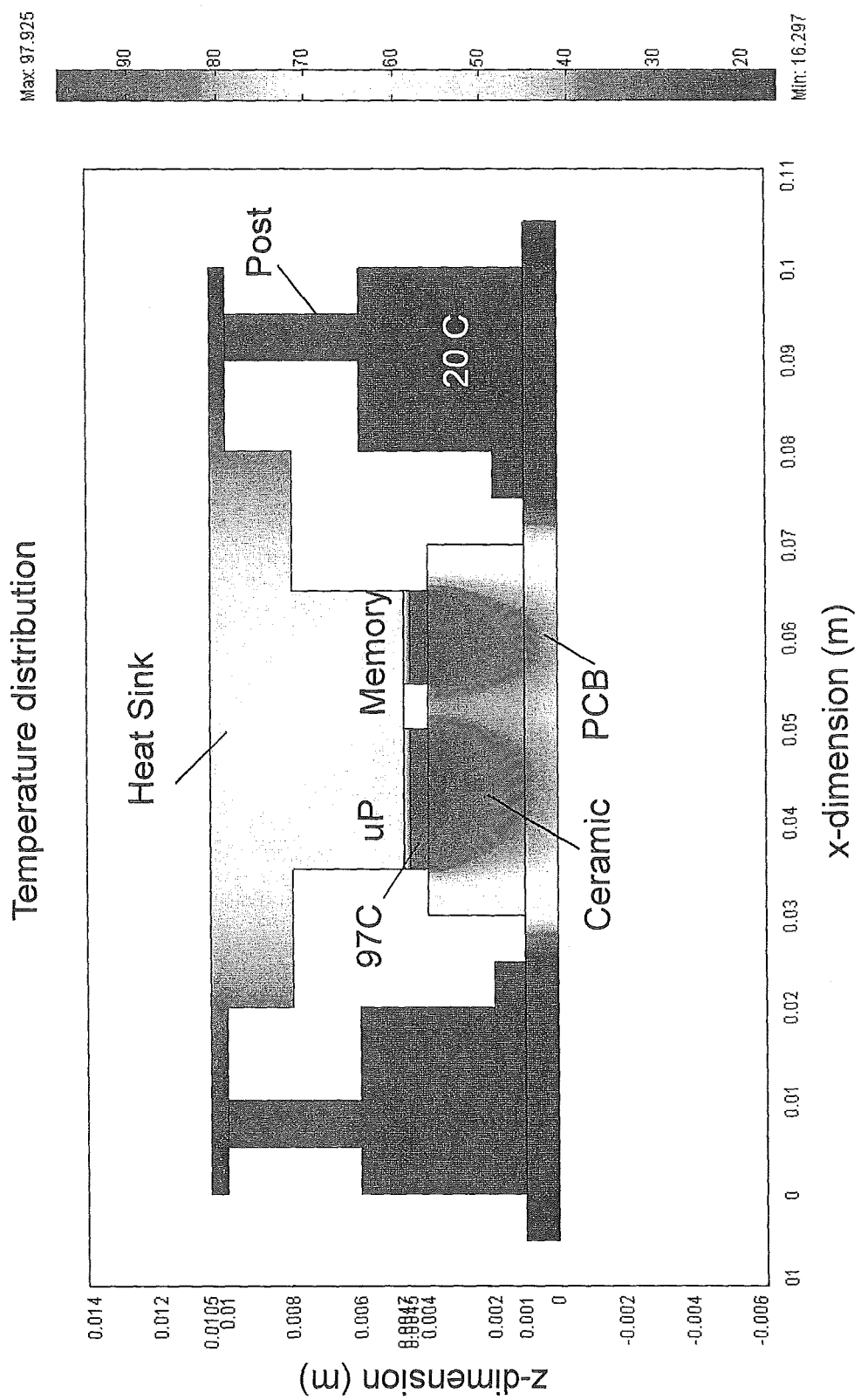
FIG. 6 illustrates an estimate of the temperature distribution after 10 seconds following a power on condition.
Figure 7:
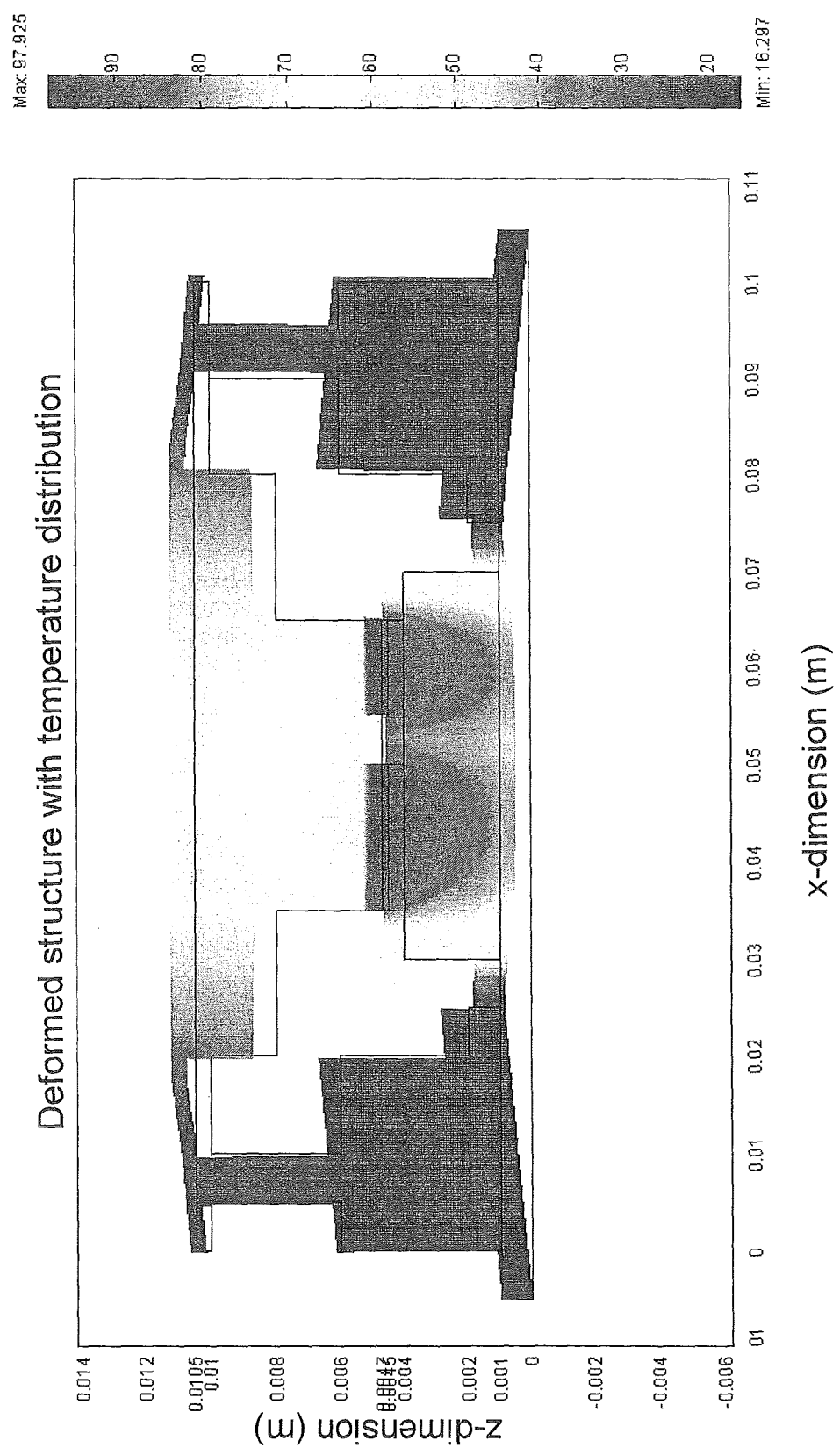
FIG. 7 shows the thermomechanically driven deformation (exaggerated scale) of the system.
Figure 8:
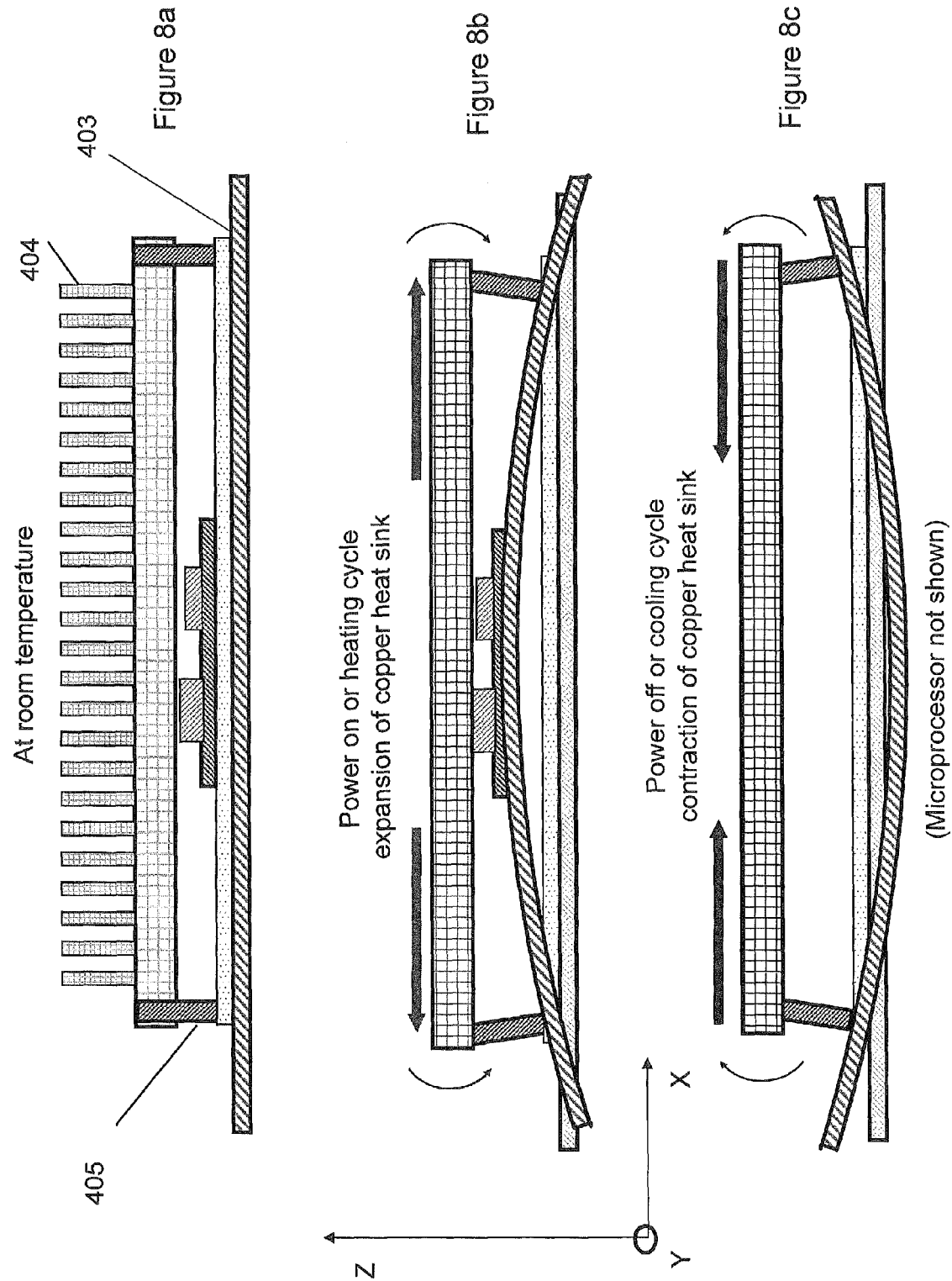
FIGS. 8a, 8b and 8c schematically show the coupling mechanism as the temperature is increased or decreased from the stress free room temperature state.
Figure 9:
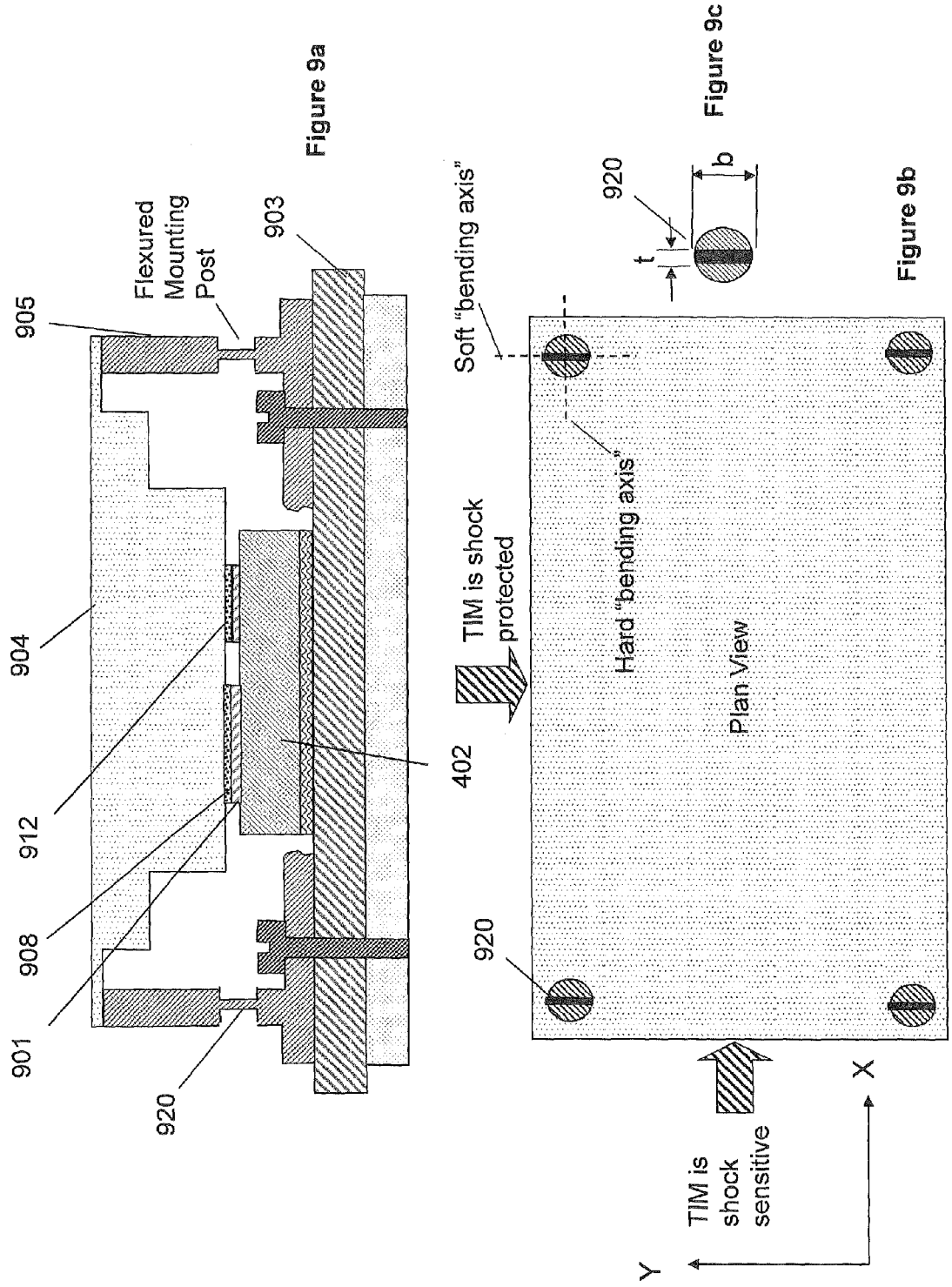
FIGS. 9a, 9b and 9c illustrate a modified mounting structure where a flexure element is added to a rigid mount. The soft "bending" axis is aligned with Y-axis, and the design is sensitive to X-directional shock applied to PCB.

FIGS. 8a, 8b and 8c show the deformation process due to heating and cooling of a heat sink of an in-plane system. FIG. 8a shows a schematic representation of an assembled system represented by FIG. 4 in which there is no substantial residual stress imparted. FIG. 8b shows the power on heating cycle in which the heat sink 404 temperature rises rapidly ahead of the PCB 403, and forces the mounting posts 405 to move outwards. The bending moment thus created causes the PCB 403 and associated laminate and die into a convex shape. The power on process would cause a tensile strain on the TIM. Once the dwell period is reached, after an elapsed period of time, the expansion process would reach a steady state and no further deformation of TIM is anticipated.

However, during the cool down or power down phase the heat sink 404 would contract much more quickly compared to PCB 403 and a reverse deformation occurs as shown by FIG. 8c. During the cooling phase, for example, below the stress free assembly temperature, the PCB 403, laminate and die could become concave and cause tearing of TIM at the center rather than at the edge of a die.

An exemplary embodiment of the invention provides a design that can decouple the heat sink expansion effect from the PCB structure by utilizing flexured mounting posts.

FIGS. 9a, 9b and 9c illustrate a basic concept applied to an in-plane heat sink 904. The flexured posts 905, for simplicity, are oriented in such a way that the easy or soft bending axis is along the Y-axis facilitating reduced compliance for X-directional motion. The flexure section 920 is illustrated in FIGS. 9a, 9b and 9c. Thus, any relative expansion of the heat sink 904 along X-direction will not force the PCB 903 to either bend or stretch.

In addition, the Y-directional expansion of the heat sink 904 would still couple the PCB 903 because the bending stiffness of the post 905 for Y-movement is still high. However, any shock applied to PCB 903 in the X-direction will translate to substantial relative motion between the heat sink 904 and PCB 903, causing TIM 908 to tear. Thus, additional design innovation is required to mitigate these challenges.

Figure 10:
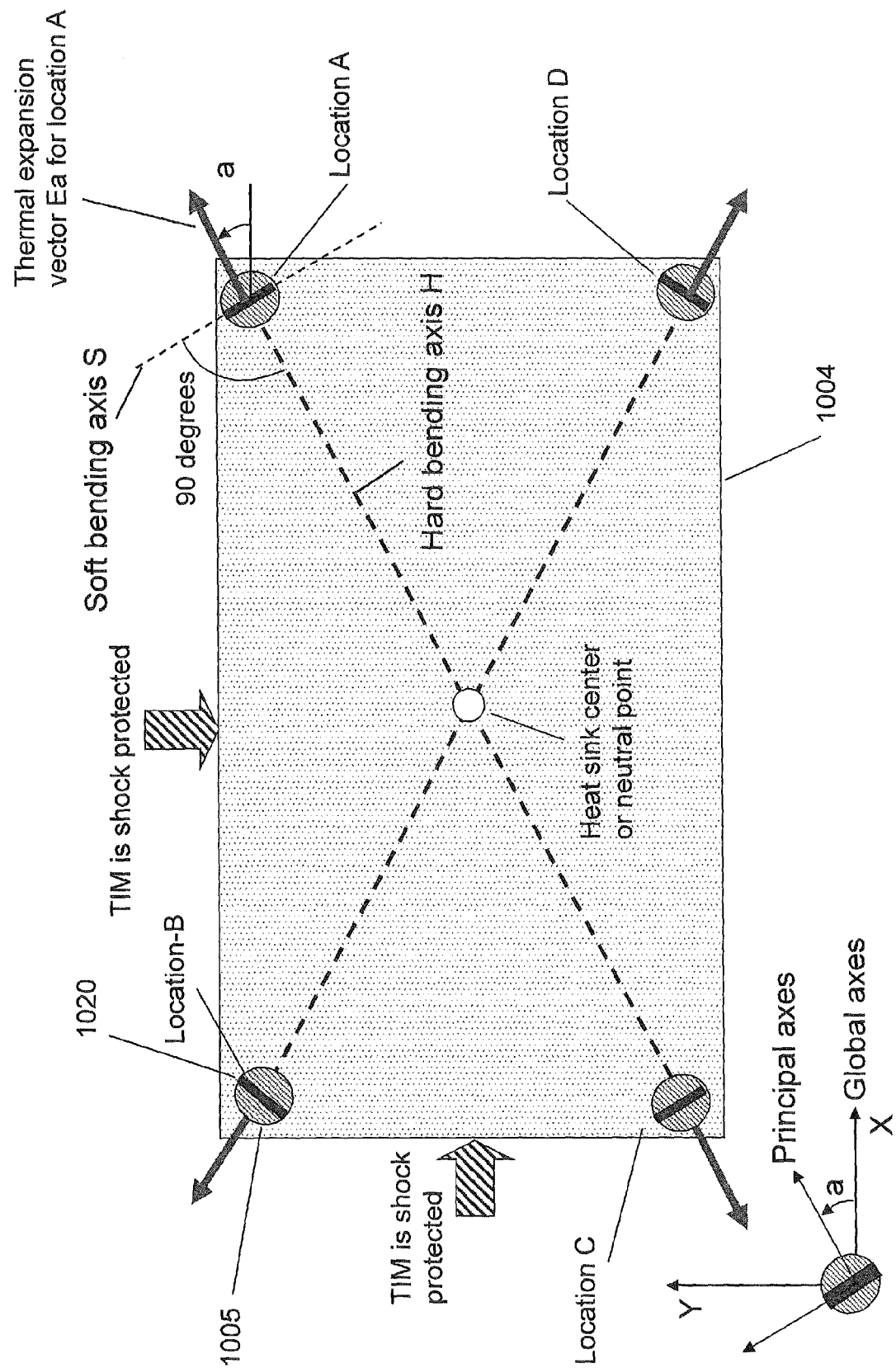
FIG. 10 illustrates an orientation of the soft bending axis of an exemplary embodiment for maximum flexibility along the thermal expansion vector while providing stiffness against X-Y shock.
Figure 11:
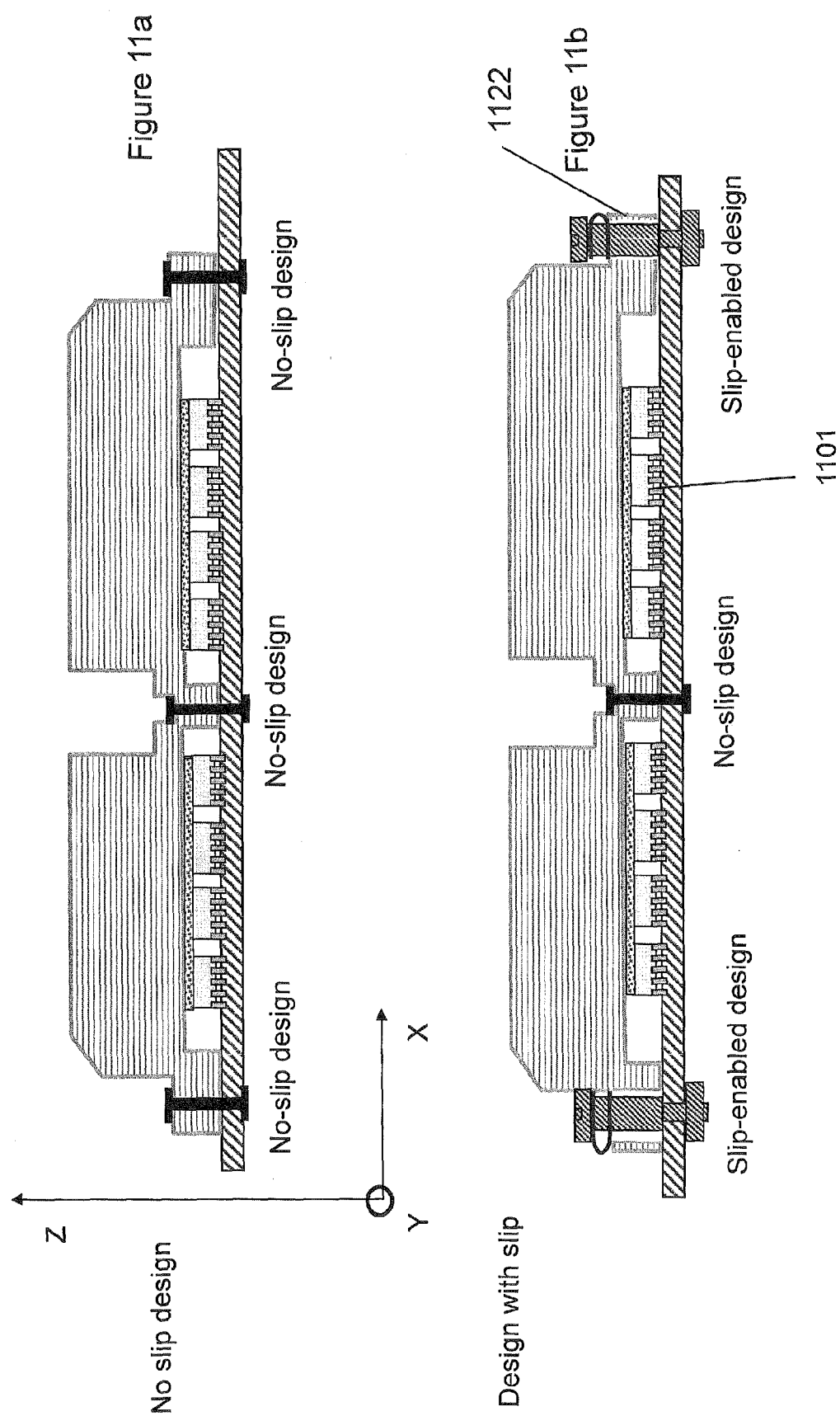
FIGS. 11a and 11b illustrate a cascaded heat sink with three mounting locations. To decouple, one point is made of no-slip mount and the remaining mounts are made with slip mounts.

In order to simultaneously reduce the bending stiffness to thermal expansion while presenting substantial stiffness against X-Y shock, the invention takes advantage of the nature of expansion process. As the temperature rises, the heat sink 1004 mounting points (e.g., A, B, C and D) displace along the diagonal vectors as shown in FIG. 10. Therefore, the bending resistance needs to be reduced only along the diagonal directions at the mounting points (e.g., at A, B, C and D).

By orienting the easy bending axis S orthogonal to the respective diagonals the thermally driven expansion process is decoupled from the PCB. In an exemplary embodiment, the soft (easy) bending axis S is orthogonal to the direction of expansion (e.g., Ea) at the mounting point (e.g., A). This technique can be done with any number of mounting posts 1005 on any shape heat sink 1004. In an exemplary embodiment the mounting posts 1005 support the heat sink 1004 in both the positive Z (up) direction and the negative Z (down) direction.

Since the specification of shock direction is either along the X or Y axis, the four flexural mounting posts can be designed to offer the required stiffness against shock induced motion. A HS mounting post with a circular cross-section has a bending stiffness that is proportional to its moment of area:

$$I_{circle} = (1/4) * pi * R^4$$

where R is the radius of a circular post. Observe that the stiffness of this system is identical in all directions, and is independent of the mounting orientation. Thus, with a mounting post having a circular cross section it is impossible to develop a decoupling design while ensuring robustness against shock.

However, if a flexured section 1020 as shown in FIG. 10 is introduced into the mounting post 1005 two distinct stiffness components are obtained. For a flexural section 1020 with a rectangular geometry (b×t with b>t), as shown in FIG. 10, the soft axis S and hard axis H (call S-H as the principal axes) will have following moment of area:

$$I_{soft} = (bt^3)/12$$

$$I_{hard} = (b^3 t)/12$$

Thus by maintaining b>>t (for example say by a factor of 10) a stiffness ratio of 100 between soft (easy) axis S and hard (stiff) axis H can be obtained.

The orientation of flexures 1020 shown in FIG. 10 also enhances shock robustness. When the principal axis H of the hard-soft flexure 1020 is rotated with respect to the global X-Y axes by an angle "a", then the effective stiffness along global X and Y axes are now given by the following equations:

$$I_x = (bt/12) * (b^2 \cos^2 a + t^2 \sin^2 a)$$

$$I_y = (bt/12) * (b^2 \sin^2 a + t^2 \cos^2 a)$$

For simplicity, for a system with a square heat sink, angle "a" will be 45 degrees, and the corresponding stiffness will be:

$$I_x = I_y = (b^3 t/24)$$

Thus, the stiffness against shock vs. thermomechanical coupling can be differentiated by a factor given by:

$$I_{soft}/I_x = 2 * (t/b)^2$$

For a case where (t/b)=(1/10), the stiffness ratio can be as much as 1:50.

Thus, it is possible to present two drastically different stiffnesses to the thermomechanical system and shock-response system using soft flexural posts 1020 whose orientations are made coincidental with the respective thermal expansion vector (e.g., Ea) of the mounting point (e.g., A).

In an exemplary embodiment of the invention an in-plane heat sink can be mounted on a flexured mounting post. In an exemplary embodiment one or more components (e.g., microprocessors, memory, etc.) can be used.

Figure 12:
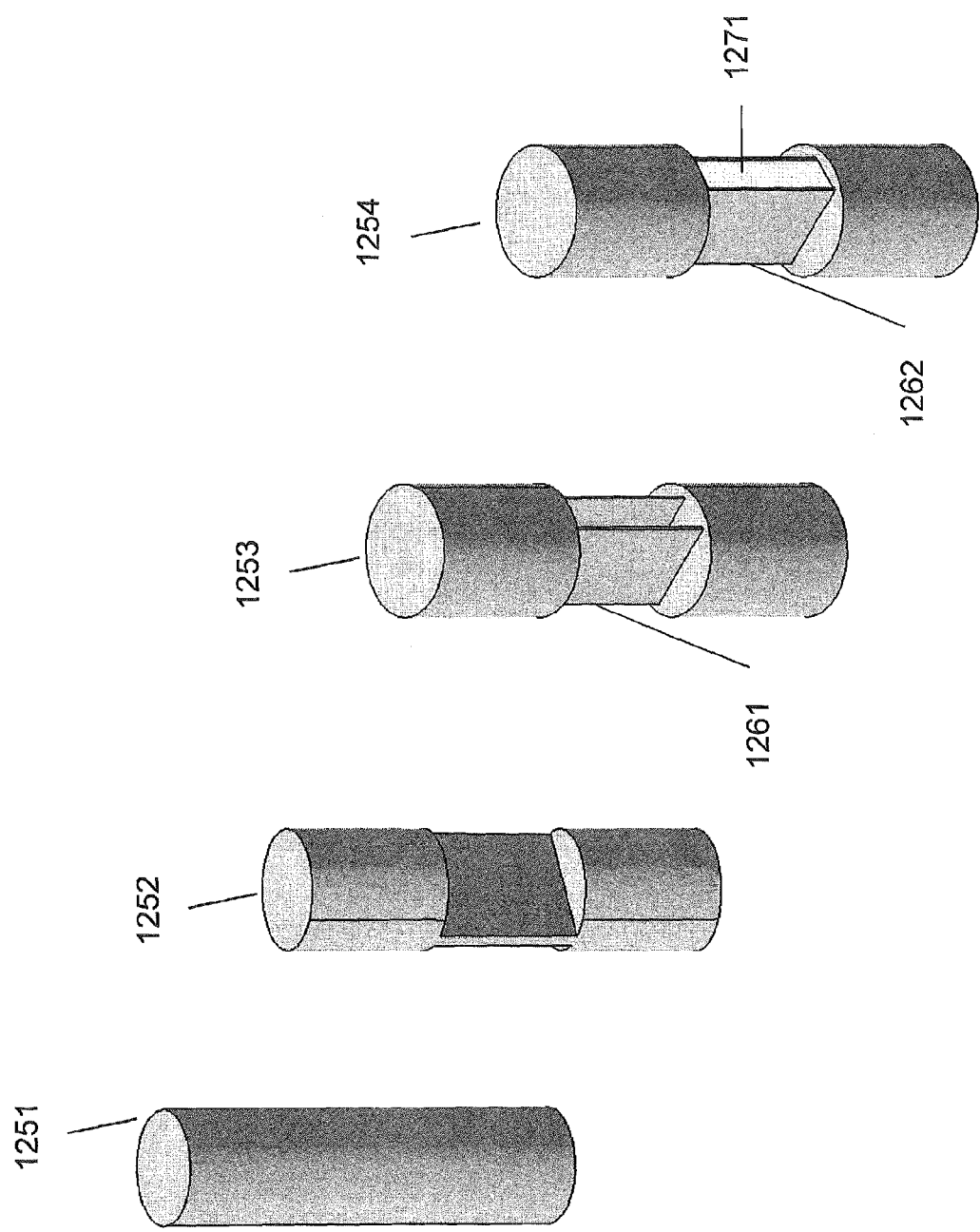
FIG. 12 illustrates various exemplary design options for mounting posts that could replace a standard mounting post to provide thermomechanical decoupling.

FIG. 12 shows an array of mounting post designs. Compared to a standard post 1251 with circular cross section, the same post can be thinned at the center zone to provide flexure action, which is referred to as a split post 1252. In another design, a flexure 1261 made of appropriate material with higher fatigue life can be embedded between two sections of a conventional circular post 1253. Finally, two parallel flexures 1262 with dampening material 1271 sandwiched in between circular posts 1254, as shown in FIG. 12, can be considered.

Figure 13:
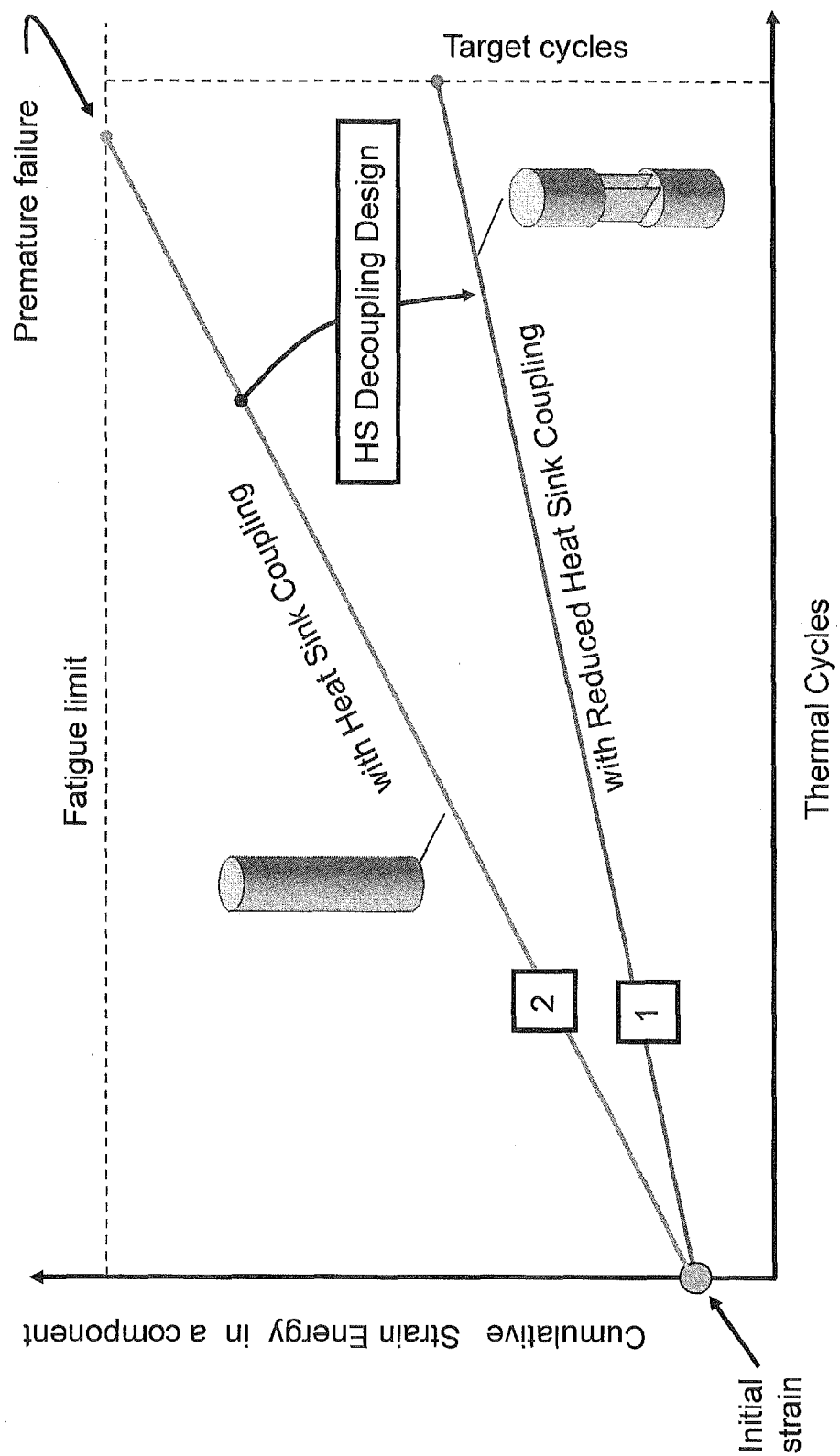
FIG. 13 shows a simplified graph of cumulative strain energy vs. thermal cycles with and without heat sink decoupling.

FIG. 13 graphically illustrates the relationship between cumulative strain energy and number of strain cycles applied to a material. In one design, where the heat sink is coupled to the PCB, the expected life time is not met. By decoupling the heat sink, the strain energy dissipated per cycle is reduced and the desired life time is met.

Figure 2:
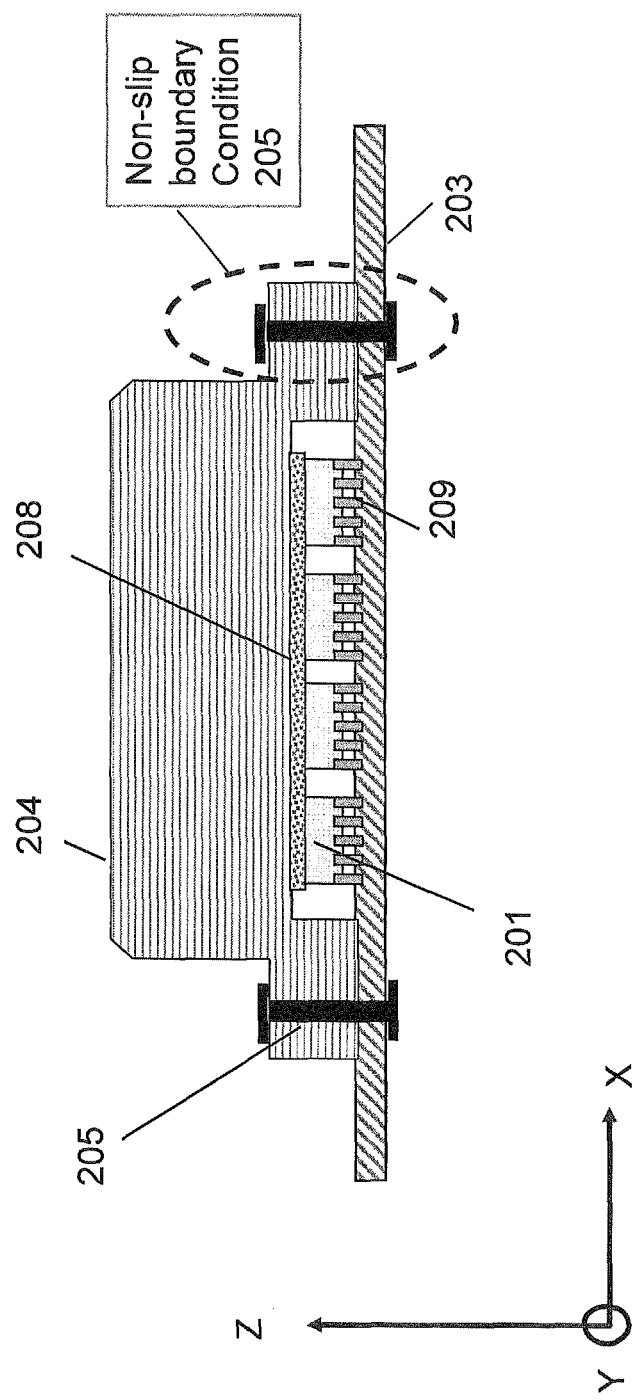
FIG. 2 illustrates a related art heat sink mount for multiple surface mounted modules.
Figure 3A:
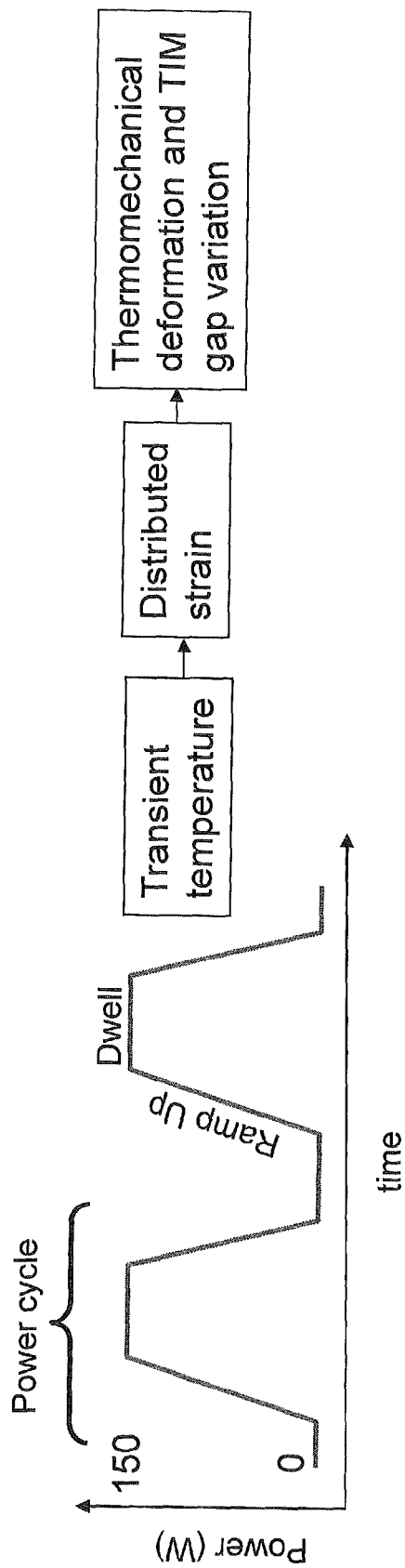
FIGS. 3a and 3b show power cycle and thermal cycle profiles and the corresponding impact of deformation on TIM and solder joints.
Figure 3B:
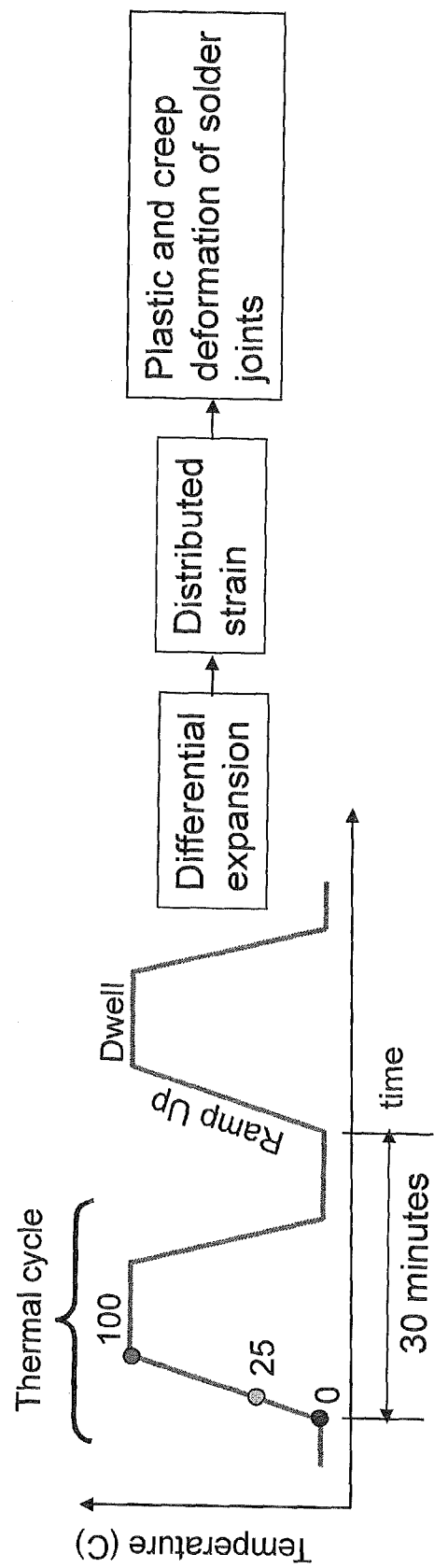

In FIG. 2, a representative 4-module in-line assembly on an organic printed circuit board 203 with a heat sink (HS) 204 was described. During a thermal cycle, the strain within the solder 209 of a module is generated as a result of external and internal thermal expansion/contract process. The strain generation mechanism for in-line as well as in-plane system is very similar, but TIM 208 failure in the in-line case is less severe because conductive tape instead of a cured thermal interface material can be inserted at the interfaces, and tearing is therefore not encountered. However, solder joint 209 fatigue failure can be a problem in the in-line heat sink systems.

FIGS. 14a and 14b show two stages of an in-line CSP 1401 structure. Prior to the HS 1404 attachment at room temperature, the solder is assumed to be stress free. Once the HS 1404 is loaded and riveted at its ends (in order to retain the preload on the thermally conductive tape) substantial stress in the solder joint is generated. The stress due to preload is not strictly cyclic, and does not contribute to fatigue life of the material. However, once the assembly is completed, thermal cycling produces cyclic stress similar to that of in-plane heat sink system.

Use of rivets 1405 reduces the cost of assembly. The rivets 1405, however, produce a nearly slip free joint which undesirably couples the heat sink 1404 to the PCB 1403. Observe that the mounting posts discussed under in-plane design can be interchangeably used for the in-line design. Only two mounting posts 1405 are required for the in-line assembly.

A finite element model of an in-line heat sink with four surface mount modules was built to analyze and compare the effect heat sink mounting with and without slip boundary condition. It was estimated that a slip-enabled mounting could reduce the strain energy density in solder joints due to thermal cycling by as much as 25%.

FIG. 16a shows a schematic of a HS 1604 assembly with a slip-joint used on a module 1601. The second end (not shown) is either riveted or mounted on a stiff post. The invention provides solution to the following two problems simultaneously. Clearance between the mounting post 1605 and HS 1604 allows the heat sink to move along X-direction without substantial resistance. Thus, the differential expansion between the organic board 1603 and the HS 1604 is decoupled.

This can be accomplished by providing an elongated hole 1618 which can optionally be filled with a compliant material 1619. Note that the second mounting point with a no-slip design provides the required shock robustness along the X-direction. The clearance along the Y-direction is minimized so that Y-directional linear shock induced force is transferred to the heat sink as a balanced force through both mounting points. In an exemplary embodiment, the elongated hole 1618 allows relative movement of the heat sink in the X-direction but not in the Y-direction.

The second feature is that the preloaded spring 1617 in the Z-direction presents a constant force on the thermal interface material 1608. Preloading through spring action is commonly used in the industry, but the shock robustness is largely overlooked by a loosely tolerant spring loaded mounting system.

In an exemplary aspect, for shock robustness of an in-line system, the shock vector should pass through the center of gravity of the heat sink and the mounting point with one fixed boundary condition. Otherwise there can be a torque that will force relative movement between the heat sink and the PCB. In the event that there is a slip boundary condition along the X-axis and a fixed boundary condition along the Y axis (e.g., see FIG. 16b) using a design, for example as denoted by elongated hole 1618 the shock vector along the Y-axis is balanced by forces generated by mounting posts on both sides. In this case, the shock vector is not passing through the center of gravity of the fixed boundary condition. When using flexures the same general principle may apply. The soft direction of displacement should be along the X-axis while the hard or stiff direction should be along the Y-axis.

FIG. 17a shows a snap-on method. This solution facilitates easy removal of HS 1704 for re-workability. An exemplary aspect of this configuration is that the split-post 1705 is supported by a platform 1717 that is surface mounted to the organic board 1703 like any other electronic component. It distributes local stress on the PCB 1703 that may result from other forms of mechanical mounting operation. FIG. 17b is a schematic representation of a snap-on fixture 1705 subsequently used in other illustrations.

Also illustrated is a spring or wave washer 1716 to impart a preload. Even though the two mounting posts (1705) appear identical, in order to survive shock, one post should be stiffer than the other to bear shock induced force while the flexible second post accommodates the thermally-induced expansion. The flexible post can be designed to have higher flexibility in X-direction (for expansion) and higher stiffness in Y-direction to bear part of the Y-direction shock and rotational shock load about Z-axis.

Figure 18A:
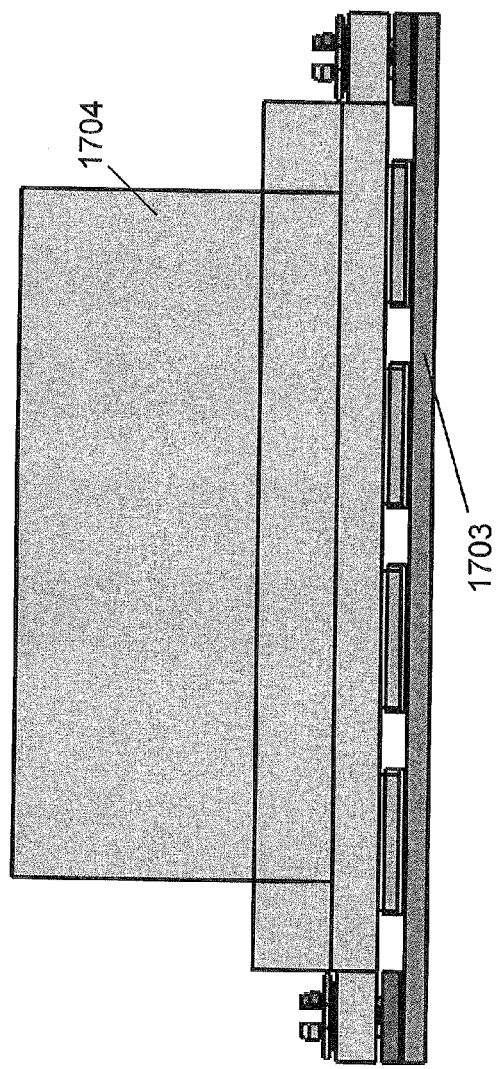
FIGS. 18a, 18b and 18c illustrate a close up view of the split-post. The split-post is attached to PCB similar to a surface mounted component.
Figure 18C:
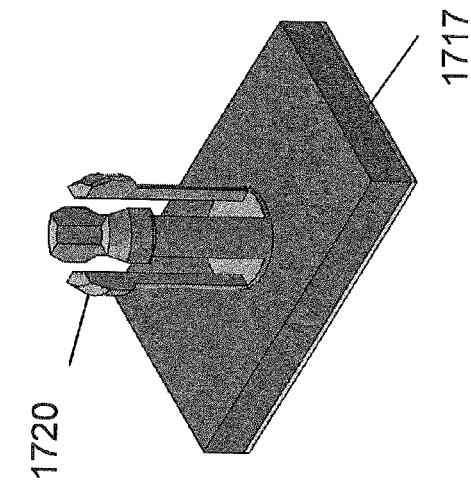
Figure 18B:
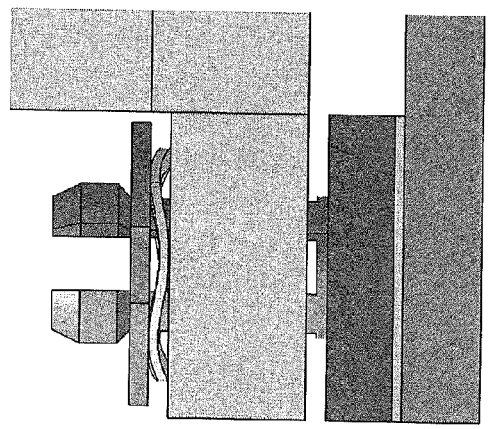

FIG. 18 shows more details of the snap-on method. By adjusting the relative stiffness of the snap post, for example by adjusting the thickness or width of each leg 1720, it is possible to have more or less stiffness in any desired direction. In addition, the four posts 1720 can be rotated or manufactured in different directions (e.g., coincidental with the X and Y direction, or 45 degrees from the X and Y direction) when FIGS. 11a and 11b show a cascade of in-line heat sinks to support a larger number of surface mounted modules. The examples shown support eight surface mounted modules. As illustrated in FIG. 11b, the center mounting point is retained with a no-slip joint, and the remaining mounting points are slip-enabled. In the illustrated embodiment of FIG. 11*b*, there would be clearance in the X-direction on both end through holes 1118.

Figure 15:
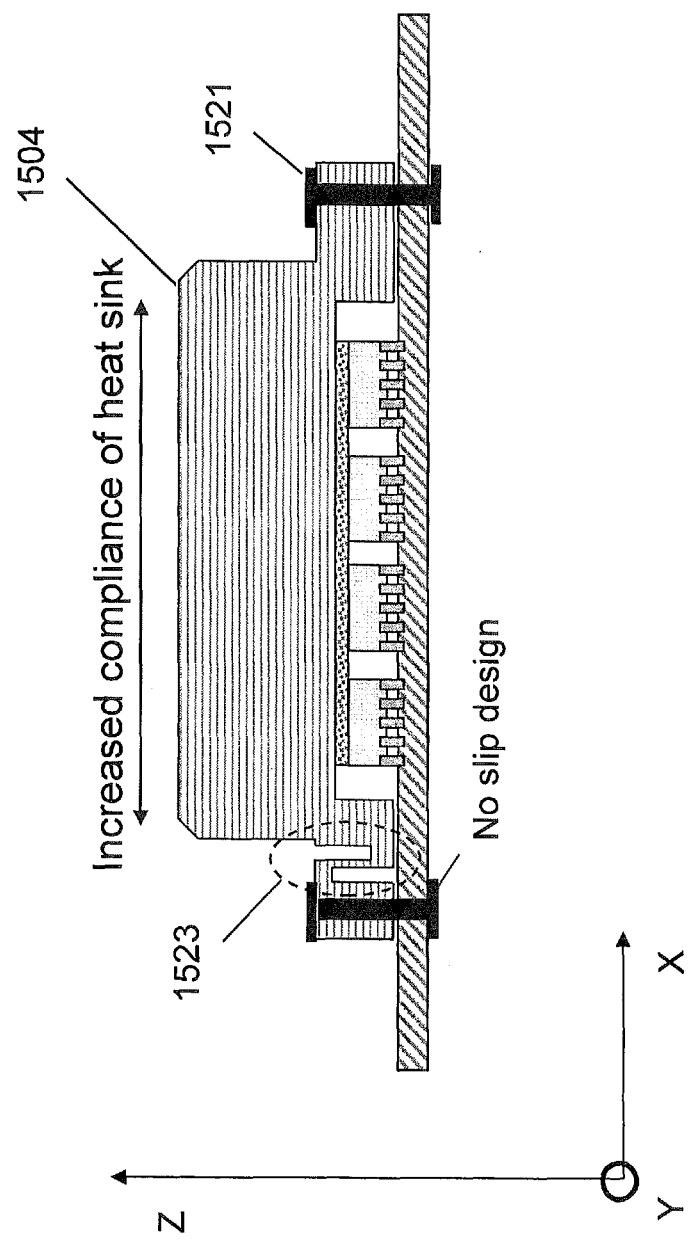
FIG. 15 illustrates a slotted in-line heat sink that provides compliance in X-direction.

FIG. 15 shows a modified in-line heat sink 1504 with multiple slots 1523 cut near one mounting location. Slots 1523 are cut in the Y-direction and they provide compliance in the X-direction without impeding the thermal performance of the heat sink 1504. By providing compliance in the X-direction, the thermo-mechanical coupling is minimized while allowing conventional mounting methods, such as low cost rivets 1521, to be employed.

While the invention has been described in terms of exemplary embodiments, those skilled in the art will recognize that the invention can be practiced with modification within the spirit and scope of the appended claims.

Further, it is noted that Applicant's intent is to encompass equivalents of all claim elements, even if amended later during prosecution.

What is claimed is:

1. A heat sink comprising:
   a body; and
   mounting points configured so as to connect to a mounting medium,
   wherein at least one of the mounting points is configured to allow movement in a thermally-induced expansion direction,
   wherein the mounting points include a mounting portion of the body and a mounting member configured to connect the mounting portion to the mounting medium,
   wherein the mounting member comprises a shaft including a non-cylindrical flexing portion between two cylindrical portions, and
   wherein the non-cylindrical flexing portion includes a plurality of flexing parts and a dampening material disposed on at least one of the plurality of flexing parts.

2. A heat sink according to claim 1, wherein the flexing portion is oriented such that a stiffness in a direction oriented along the thermally-induced expansion direction at the mounting member is less than a stiffness along an other direction at the mounting member.

3. A heat sink according to claim 1, wherein the non-cylindrical flexing portion includes a rectangular portion of the mounting member.

4. A heat sink according to claim 1, wherein the non-cylindrical flexing portion includes two flexing parts, the flexing parts comprising a material different from a material of the two cylinder portions.

5. A heat sink comprising:
   a body; and
   mounting points configured so as to connect to a mounting medium,
   wherein at least one of the mounting points is configured to allow movement in a thermally-induced expansion direction,
   wherein the mounting points include a mounting portion of the body and a mounting member configured to connect the mounting portion to the mounting medium,
   wherein the mounting member comprises a shaft including a non-cylindrical flexing portion between two cylindrical portions, and
   wherein the non-cylindrical flexing portion includes two flexing parts, the flexing parts comprising a material different from a material of the two cylinder portions.

* * * * *